United States Patent
Kaehs et al.

(10) Patent No.: US 8,749,304 B2
(45) Date of Patent: Jun. 10, 2014

(54) CIRCUIT ARRANGEMENT FOR A REDUNDANT POWER SUPPLY FOR A POWER AMPLIFIER

(75) Inventors: Bernhard Kaehs, Unterhaching (DE); Ludwig Moll, Raisting (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 44 days.

(21) Appl. No.: 13/519,574

(22) PCT Filed: Dec. 1, 2010

(86) PCT No.: PCT/EP2010/007306
§ 371 (c)(1),
(2), (4) Date: Jun. 27, 2012

(87) PCT Pub. No.: WO2011/079901
PCT Pub. Date: Jul. 7, 2011

(65) Prior Publication Data
US 2012/0280750 A1      Nov. 8, 2012

(30) Foreign Application Priority Data

Dec. 28, 2009  (DE) .......................... 10 2009 060 671
Mar. 30, 2010  (DE) .......................... 10 2010 013 331

(51) Int. Cl.
*H03F 1/14*          (2006.01)

(52) U.S. Cl.
USPC ........................................... 330/51; 330/297

(58) Field of Classification Search
USPC ................. 330/51, 297, 207 P, 298
See application file for complete search history.

(56) References Cited

U.S. PATENT DOCUMENTS

| | | | |
|---|---|---|---|
| 4,890,217 A * | 12/1989 | Conway ...................... | 363/143 |
| 5,241,255 A * | 8/1993 | Oshima et al. ............... | 318/801 |
| 5,561,397 A | 10/1996 | Kumar | |
| 6,064,260 A * | 5/2000 | Montgomery et al. ....... | 330/127 |
| 7,554,276 B2 * | 6/2009 | Galli et al. ................... | 318/109 |

FOREIGN PATENT DOCUMENTS

| | | |
|---|---|---|
| EP | 1 750 366 A2 | 2/2007 |
| EP | 1 835 711 A1 | 9/2007 |
| JP | 59-172816 A | 9/1984 |
| JP | 2005-057377 A | 3/2005 |
| WO | 2005/046198 A1 | 5/2005 |

OTHER PUBLICATIONS

International Search Report mailed Apr. 1, 2011, issued in corresponding International Application No. PCT/EP2010/007306, filed Dec. 1, 2010, 3 pages.

International Preliminary Report on Patentability mailed Jul. 19, 2012, issued in corresponding International Application No. PCT/EP2010/007306, filed Dec. 1, 2010, 6 pages.

* cited by examiner

*Primary Examiner* — Henry Choe
(74) *Attorney, Agent, or Firm* — Christensen O'Connor Johnson Kindness PLLC (57) ABSTRACT

The switching arrangement is used for the redundant power supply for a power amplifier, especially a high-frequency power amplifier. The power amplifier in this context provides several output-stage components and several power-supply units. The power-supply units are connected together at their load-end connections and supply the output-stage components jointly with energy. If a power-supply unit fails, at least two output-stage components are actively switched off, so that the power amplifier can continue to operate although with reduced output power.

16 Claims, 5 Drawing Sheets

CIRCUIT ARRANGEMENT FOR A REDUNDANT POWER SUPPLY FOR A POWER AMPLIFIER

FIELD OF THE DISCLOSURE

The invention relates to a circuit arrangement for a redundant power supply for a power amplifier, in particular, for a high-frequency power amplifier such as those used in telecommunications to broadcast radio and television signals, in mobile-telephone base stations, in radar technology, in EMC measurement technology and for scientific purposes in generating large high-frequency powers.

BACKGROUND

High-frequency power amplifiers typically comprise several single high-frequency output-stage amplifiers which are connected to high-frequency output-stage components by couplers (power splitters and power couplers). Only in this manner is the required total power output achieved. The failure of one or more of these high-frequency output-stage amplifiers results in reduced output power, however, transmission—with reduced signal-to-noise ratio S/N at the reception site—is still possible with reduced output power. The remaining output power can be calculated with the formula $P_{out}=P_{nom}*m^2/n^2$, where $P_{out}$ denotes the remaining output power, $P_{nom}$ denotes the nominal output power when all output-stage amplifiers are functioning, [m] denotes the number of functional output-stage amplifiers and [n] denotes the total number of output-stage amplifiers.

By contrast, transmission is no longer possible in the event of a failure of a power-supply unit if this is not embodied in a redundant manner. Precisely such power-supply units are subject to a relatively high risk of failure, as they form the connection between the mains electricity supply and the component groups in the individual devices. The quality of the mains supply is highly variable, not only in different countries but also within industrial plants, so that large voltage fluctuations, voltage spikes or brief supply interruptions are not uncommon. Additionally, increasingly faster and more powerful component groups and, at the same time, the demand for more compact power-supply units have resulted in complex switching units which comprise many heavily loaded components and are accordingly subject to statistical failures. A redundant power supply for the power amplifier is therefore desirable in order to increase operational reliability.

A redundant arrangement of power-supply units which supply a number of independent high-frequency power amplifiers is known from U.S. Pat. No. 6,064,260. Every high-frequency power amplifier provides a power-supply unit, a high-frequency power stage and a linearizer, wherein the high-frequency power stage and the linearizer represent the load on the power-supply unit and are supplied with energy from the latter. At the same time, all power-supply units are connected to a power-supply bus. In the event of a failure of a power-supply unit, this generates an error signal which opens a switch and separates the power-supply unit from the load of the high-frequency power amplifier and the power-supply bus. The remaining power-supply units are dimensioned in such a manner that they can continue supplying the high-frequency power amplifier in which the power-supply unit failed with energy. In addition, a current sensor registers the current consumption of the connected load. If the current consumed is not within a defined range, this points to an error in the high-frequency power stage or the linearizer. A switch then separates the load from the power-supply unit of the power amplifier and from the power-supply bus.

The disadvantage of the arrangement according to U.S. Pat. No. 6,064,260 is that it is not possible to switch off individual output-stage amplifiers which together form a high-frequency power amplifier. The high-frequency amplifier must either continue to operate or must be switched off as a whole, wherein, in the latter case, it ceases to transmit a signal. No provision is made here for operation with reduced output power. In order to secure a redundancy, all power-supply units must be significantly oversized. If, for example, only two high-frequency power amplifiers are each connected to a power-supply unit via the power-supply bus, each power-supply unit must be designed for double the power in order to be able to supply the other power amplifiers with energy in the event of a failure. Otherwise one or both current sensors for the high-frequency amplifiers would report an error, which would lead to one or both high-frequency amplifiers being disconnected from the power-supply bus via the corresponding switch. But at least one high-frequency amplifier would completely cease to operate. In order to achieve a redundancy, the cost of the whole arrangement, in particular with power-supply units with an output of many kilowatts, increases significantly. If, for example, more than two high-frequency power amplifiers are connected to the power-supply bus, the output reserve of the power-supply units can be reduced to a certain extent, however, different power-supply units must be used in order to supply identical amplifier stages dependent on the number of individual power amplifiers. The different size of the power-supply units makes a unified housing design for a variable number of power amplifiers within one housing impossible. In the event of an error, the switches used still need to be able to switch off a short-circuit current of more than 100 A in some cases. The size and the costs for one such switch are therefore not negligible.

SUMMARY

The invention is therefore based on the object of providing a switch arrangement for the redundant power supply of the power-supply unit of a high-frequency power amplifier, in which the individual power-supply units have a relatively low power reserve and which allow continued operation, although with reduced transmission power in the event of a failure of at least one power-supply unit. The power-supply units used for this should be uniform in order to achieve favorable general conditions with regard to the purchase and design of the housing.

The object is achieved by a switch arrangement with the features of claim 1. Further advantageous developments of the invention form the subject matter of the dependent claims.

The switch arrangement according to the invention provides a redundant power supply for a power amplifier, especially a high-frequency power amplifier, wherein the power amplifier comprises several output-stage components and several power-supply units. The power-supply units are connected at their load-end connections and collectively supply the output-stage components with energy. If at least one power-supply unit fails, at least one output-stage component is immediately actively switched off.

Since various output-stage components of a power amplifier are supplied by a common supply line from various power-supply units, operation continues in the event of a failure of a power-supply unit without the remaining power-supply units having to take over the supply in a compulsory manner. As a consequence of a failure of a power-supply unit, a given number of output-stage components are switched off, wherein continued operation, although with reduced transmission power, is still possible. The power of the power-supply units can therefore be matched with normal operation without loss of redundancy. Furthermore, the power-supply units preferably provide the same structural shape, which makes integration into the housing easier.

A further advantage of the invention is that all power-supply units are connected to at least one common filter by their common load-end connection point. Particularly with high powers of, for example, several kilowatts, a common filter which protects the power-supply units from an influence of high-frequency energy of the output-stage components is significantly more favorable than if a separate filter is used for each power-supply unit. The necessary space for such a common filter is also significantly less in comparison with several individual filters.

It is also advantageous that, as well as the output-stage components of the power amplifier, functional units within the power amplifier, such as the pre-amplifier, the driver amplifier, the control, the power control unit including a high-frequency detector, the error control unit and several fans are also supplied from all power-supply units via a common supply line. In this manner, the various central components as well as the output-stage components can be supplied with energy in a redundant manner without incurring additional costs in the form of further power-supply units.

An advantage of one embodiment of the switch arrangement for a redundant power supply according to the invention is that, in the event of a failure, each power-supply unit outputs via a status line an error signal, which is used to switch off a given number of output-stage components. This is achieved via a switch element which connects the bias voltage of the power transistor of the affected output-stage component, for example, to earth. In this manner, in order to avoid intermodulation products, the high-frequency control power is de-coupled from the output-stage component via a switch element. For this purpose, those output-stage components which are collectively controlled by a 90° hybrid coupler are always switched off in pairs in order to direct the resulting reflections into the load-balancing resistor. This ensures that exactly identical operational conditions prevail for the remaining, still operational output-stage components in respect of the level or frequency response. In this context, the switch element only needs to switch a very small signal current, so that it can be built up from SMD-components (surface-mounted device; surface mounted component).

In a further embodiment according to the invention with two or more power-supply units, the status lines are connected directly with open collector outputs of all power-supply units to each other and to a given number of switch elements and/or switch units of the output-stage components. The connection of the status lines to each other operates in the manner of an OR-function. This ensures that, without a further control unit, the necessary number of output-stage components is switched off in the event of a failure of a power-supply unit, and an operation can be sustained via the remaining power-supply units, although with reduced output power.

In a further embodiment according to the present invention, the status unit of every power-supply unit is individually connected to a logic unit. The outputs of the logic unit are accordingly connected to different SWITCHING elements and switching units. The logic unit determines how many and which output-stage components are switched off in the event of a failure of one or more power-supply units. In this manner, a sufficiently high redundancy can be achieved with a minimal number of switching elements and switching units.

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

DESCRIPTION OF THE DRAWINGS

Different exemplary embodiments of the invention are described by way of example below with reference to the drawings. The same reference numbers refer to identical subject matters. The corresponding Figures of the drawings are as follows.

DETAILED DESCRIPTION

Figure 1:
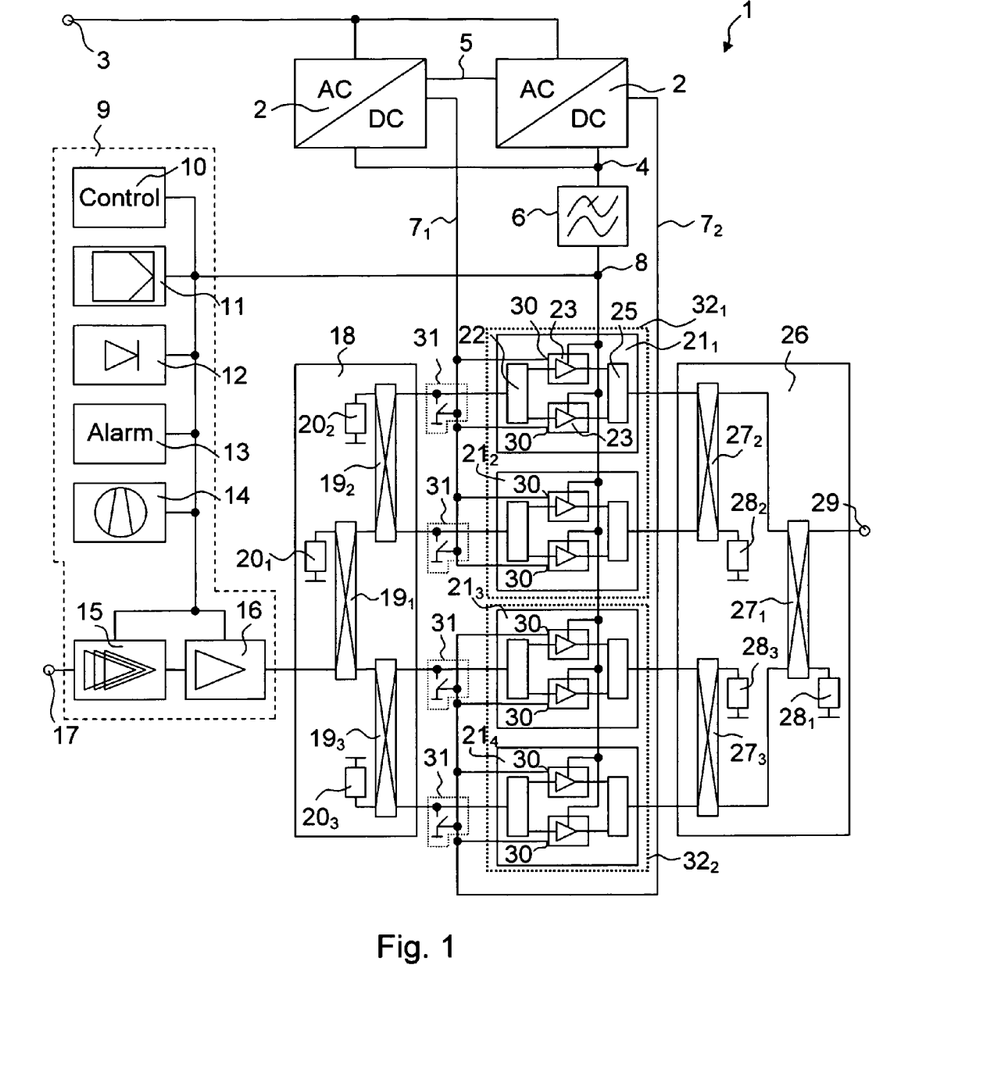
FIG. 1 shows a circuit diagram of a first exemplary embodiment of the circuit arrangement according to the invention for the redundant power supply for a power amplifier.

FIG. 1 shows a circuit diagram of the circuit arrangement according to the invention for the redundant power supply for a power amplifier 1. The power amplifier 1 provides two power-supply units 2, which draw energy at the input-end, preferably from the mains power supply, via a connection 3. The load-end outputs of both power-supply units 2 are connected to each other at the node 4. Both power-supply units 2 are connected in parallel. Via a line 5, both power-supply units 2 are synchronized with one another, so that a load connected to the node 4 is uniformly subdivided between the power-supply units 2, and every power-supply unit 2 provides the same power in each case.

At the load-end connection of both power-supply units 2, a common filter 6 is connected to the node 4. This filter 6 serves to protect both power-supply units 2 at their load-end output from interference through high-frequency energy occurring in the amplifier. The filter 6 can be realized as a T-filter or PI-filter, wherein this filter is designed for currents of, for example, up to 150 A. Through the interconnection of the two power-supply units 2 and the resulting common supply line, this filter is required only once. This achieves space and cost savings. Furthermore, both power-supply units 2 are provided in such a manner that, in the event of a failure, the affected power-supply unit 2 does not connect a short-circuit at its load-end output. Furthermore both power-supply units 2 provide a status line $7_1$, $7_2$ which is connected respectively to the power-supply unit 2 via an open collector (open collector). In the event of a failure of a power-supply unit 2, the status line $7_1$ or $7_2$ is connected to earth.

The common supply line 8, which is connected to both power-supply units 2 via the filter 6, supplies a number of individual component groups within the power amplifier 1. Some of these component groups are necessary for the operation of the power amplifier 1 and must compulsorily continue to be supplied with energy in the event of a failure of a power-supply unit 2, in order to avoid a total failure. These component groups comprise the central functional units 9, the components such as a control 10, a power regulator 11 with high-frequency detector 12, an error monitor 13, at least one fan 14, a pre-amplifier 15 and a driver amplifier 16. All of these functional units 9 are connected to the common supply line 8.

At the input 17, a signal to be amplified from a signal source, which is not illustrated, is supplied to the pre-amplifier 15 of the power amplifier 1. The output of the pre-amplifier 15 is connected to the input of the driver amplifier 16. The output of the driver amplifier 16 is connected to a power splitter 18. The power splitter 18 comprises three couplers $19_1$, $19_2$, $19_3$, which are preferably embodied as 90° hybrid couplers, and divides an input signal down to several output signals with a relatively lower level. The first coupler $19_1$ can also be embodied, for example, as a Wilkinson coupler, or it can provide any arbitrary design. The first coupler $19_1$ is, however, in this case also realized as a 90° hybrid coupler $19_1$, wherein its input is connected to the connection of the driver amplifier 16. An output of the first 90° hybrid coupler $19_1$ is connected to earth via a load-balancing resistor $20_1$. The load-balancing resistor 20 absorbs the power difference between the input and the outputs. A further output of the first 90° hybrid coupler $19_1$ is connected to the input of a second 90° hybrid coupler $19_2$. A third output of the first 90° hybrid coupler $19_1$ is connected to the input of a third 90° hybrid coupler $19_3$. The signal coming from the driver amplifier 16 provides a phase displacement of −90° at the output of the first 90° hybrid coupler $19_1$ and at the input of the second 90° hybrid coupler $19_2$.

The second 90° hybrid coupler $19_2$ provides at one output a load-balancing resistor $20_2$, which is connected to earth. A further output of the 90° hybrid coupler $19_2$ is connected to an output-stage component $21_1$. The signal at the input of the output-stage component $21_1$ is displaced through −180° with reference to the signal at the output of the driver amplifier 16. A further output of the 90° hybrid coupler $19_2$ is connected to the output-stage component $21_2$. The signal at the input of the output-stage component $21_2$ is displaced through −90° with reference to the signal at the output of the driver amplifier 16.

The third 90° hybrid coupler $19_3$ provides at one output a load-balancing resistor $20_3$, which is connected to earth. A further output of the 90° hybrid coupler $19_3$ is connected to an output-stage component $21_3$. The signal at the input of the output-stage component $21_3$ is not displaced with reference to the signal at the output of the driver amplifier. A further output of the 90° hybrid coupler $19_3$ is connected to the output-stage component $21_4$. The signal at the input of the output-stage component $21_4$ is displaced through −90° with reference to the signal at the output of the driver amplifier 16.

Via the three 90° hybrid couplers $19_1$, $19_2$, $19_3$, an input signal is subdivided into four signals, which can be phase-displaced with reference to the input signal, and the level of which is in each case one quarter of the level of the input signal upon matching. The first 90° hybrid coupler $19_1$ can also be embodied as a Wilkinson coupler. The signals at its output must provide no phase displacement relative to one another in this context.

The different output-stage components $21_1$, $21_2$, $21_3$, $21_4$ are preferably structured in an identical manner. An input signal coming from the output of a 90° hybrid coupler $19_2$, $19_3$ is supplied to a power splitter 22. This power splitter subdivides the input signal uniformly into two signals. These signals are each supplied to an output-stage amplifier 23. Each of these output-stage amplifiers 23 is connected to the common supply line 8. The output of each of these output-stage amplifiers 23 is connected to a power coupler 25. This power coupler 25 combines two signals to form one signal with a relatively higher amplitude. In this exemplary embodiment the power amplifier provides at least two power-supply units 2 and at least four output-stage components 21, wherein the power-supply units are connected together at their load-end connections and supply energy to the output-stage components. Two output-stage components $21_1$, $21_2$ and $21_3$, $21_4$ are each driven by one 90° hybrid coupler $19_2$, $19_3$ and each form an output-stage component $32_1$ and $32_2$. In the event of a failure of a power-supply unit 2, two output-stage components $21_1$, $21_2$ or $21_3$, $21_4$ or respectively one such output-stage component $32_1$, $32_2$ is/are actively switched off.

The concept of actively switching off in this exemplary embodiment should be understood to mean that, as well as the bias voltage of the power transistors of the output-stage components 21 being switched off, the high-frequency control power of the affected output-stage component 21 is also de-coupled. This is implemented directly by means of a control signal on a status line 7, which is itself output from the affected power-supply unit 2. At this point, no additional equipment, for example, which detects the currents on the lines and outputs a delayed adjustment instruction, is necessary. This control signal is supplied to the switching units 31 and switching elements 30 of the affected output-stage component 21. The control signal can be an error signal, which indicates, for example, the failure of the power-supply unit 2. The control signal itself can, however, also be output as soon as a load status classifiable as critical is reached, or a component inside the power-supply unit 2 operates outside defined parameters. Precisely this last operating status cannot be registered with external equipment.

The output of the power coupler 25 of the various output-stage components $21_1$, $21_2$, $21_3$, $21_4$ is connected to a power coupler 26. The power coupler 26 in this example comprises three 90° hybrid couplers $27_1$, $27_2$, $27_3$ which are disposed opposite to the three 90° hybrid couplers $19_1$, $19_2$, $19_3$ of the power splitter 18. Accordingly, the individual input signals, which are phase-displaced relative to one another, are combined to form an output signal in such a manner that the input signals are in each case added together and do not cancel each other out. At the output connection 29, an output signal is provided, the amplitude of which combines the sum of the amplitude of the signals at the outputs of the individual output-stage amplifiers 23 of the individual output-stage components $21_1$, $21_2$, $21_3$, $21_4$.

For this purpose, the signal at the output of the first output-stage component $21_1$ is supplied to a first input of a second 90° hybrid coupler $27_2$. A further signal at the output of the second output-stage component $21_2$ is supplied to a second input of the second 90° hybrid coupler $27_2$. An output of the 90° hybrid coupler $27_2$ is connected to a load-balancing resistor $28_2$, which is connected to earth. The signal, which is present at the second output of the second 90° hybrid coupler, is displaced by the second 90° hybrid coupler $27_2$ through −90° and is therefore in phase with the signal which is present at the first output of the 90° hybrid coupler $27_2$. A sum of both signals is present at a further output of the 90° hybrid coupler $27_2$, which is connected to the first input of the 90° hybrid coupler $27_1$.

The same applies for the signals in the third 90° hybrid coupler $27_3$ of the power coupler 26. A signal at the output of the third output-stage component $21_3$ is supplied to a first output of a third 90° hybrid coupler $27_3$. A further signal at the output of the fourth output-stage component $21_4$ is supplied to a second input of the third 90° hybrid coupler $27_3$. An output of the 90° hybrid coupler $27_3$ is connected to a load-balancing resistor $28_3$, which is connected to earth. The signal, which is present at the first input of the third 90° hybrid coupler $27_3$, is displaced through −90° by the third 90° hybrid coupler $27_3$ and is therefore in phase with the signal which is present at the first input of the 90° hybrid coupler $27_3$. A sum of both signals is present at a further output of the 90° hybrid coupler $27_3$, which is connected to the second input of the 90° hybrid coupler $27_1$.

An output of the first 90° hybrid coupler $27_1$ is connected to a load-balancing resistor $28_1$ which is connected to earth. The signal which is present at the second input of the first 90° hybrid coupler $27_1$ is displaced through −90° by the first 90° hybrid coupler $27_1$ and is therefore in phase with the signal which is present at the first input of the 90° hybrid coupler $27_1$. A sum of both signals is present at a further output of the 90° hybrid coupler $27_1$ which is connected to the output connection 29.

The coupler $27_1$ does not need to be a 90° hybrid coupler. It can be embodied, for example, as a Wilkinson coupler. However, it is advantageous if both couplers $19_1$ and $27_1$ are of the same type.

In the event of a failure of a power-supply unit 2, in order to ensure that the power amplifier 1 continues to operate, although with reduced output power, sufficient consumers must be switched off so that the remaining consumers can continue to be supplied by the power-supply unit 2 still available. In this context, it must be taken into consideration that it is compulsory for the central functional units 9 to be supplied with energy. In this exemplary embodiment of the invention, every power-supply unit 2 can supply two output-stage components 21 and the central functional units 9 with energy. If one power-supply unit 2 fails, the potential of the associated status line $7_1$ or $7_2$ is connected to earth by means of the open common-collector circuit.

Accordingly, the status line $7_1$ of the first power-supply unit 2 is connected to a switching element 30, which is not shown in this diagram and is disposed inside the output-stage amplifier 23 of the output-stage components $21_1$ and $21_2$. Via this switching element 30, which is not shown, the bias voltage of the individual power transistors inside the output-stage amplifier 23 is switched off. Accordingly, the power input of the output-stage unit is reduced almost to zero. However, the output-stage amplifiers 23 continue to be supplied with a constant high-frequency input power via the power splitters 18, 22. Dependent upon the amplification technology used, intermodulation products, which reach the output connection 29 of the power amplifier 1 via the power couplers 25 and 27, can occur in the output-stage amplifier 23, because the individual power transistors in this case operate in a strongly nonlinear manner.

Accordingly, it may still be necessary for the high-frequency input power to be de-coupled from the output-stage amplifiers 23 which have already been actively switched off. For this purpose the lines which connect the two outputs of the power splitter $19_2$ to the inputs of the output-stage components $21_1$ and $21_2$ are connected to earth via the switching unit 31. The switching unit 31, which is described in greater detail below, is activated via the error signal of the status line $7_1$. Accordingly, no further high-frequency input power is supplied to the output-stage amplifiers 23, which have already been actively switched off, so that no further intermodulation products occur at the output connection 29 of the power amplifier 1. However, this design is only meaningfully possible, if the power splitters 18 are built up using 90° hybrid technology. Only in this case can the occurrence of an error matching of the power splitters 18 during the switching-off of the bias voltage of the power couplers and also during the decoupling of the high-frequency input power be reliably avoided. Accordingly, the reflected power is absorbed in the load-balancing resistor. This avoids pronounced waviness and the associated occurrence of unwanted frequency responses. The remaining output-stage components still in operation continue to be operated at the operating point with the same input signal without being influenced by the output-stage components which have been switched off. The switching unit 31 can also be disposed behind the power splitter 22, which, in the exemplary embodiment, is also embodied as a 90° hybrid coupler and must provide a load-balancing resistor. A detailed description is provided in the description for FIG. 5.

The same applies to the output-stage components $21_3$, $21_4$. The status line $7_2$ of the second power-supply unit 2 here is connected to a switching element 30, which is not illustrated, within the output-stage amplifiers 23 of the output-stage components $21_3$, $21_4$. In the event of a failure of the second power-supply unit, the bias voltage of the individual power transistors within the output-stage amplifiers 23 is switched off by an error signal on the status line $7_2$ through the switching element 30 which is not illustrated here.

In order to avoid intermodulation products, the high-frequency input power can be de-coupled from the already actively switched off output-stage amplifiers 23 of the output-stage components $21_3$, $21_4$. This happens, as already explained, in that the lines which connect both outputs of the power splitter 18 to the inputs of the output-stage components $21_3$, $21_4$ are each connected to earth via a switching unit 31. These switching units 31 are activated by the error signal of the status line $7_2$.

With the illustrated type of wiring, the status line 7 of each power-supply unit 2 is connected to a given number of switching elements 30 and switching units 31. However, this type of wiring can be continued indefinitely for n power-supply units 2. In this case, the status lines 7 of n power-supply units 2 are connected to p switching elements 30 and optionally to q switching units 31. It should therefore be noted that the power splitter 18 and the power coupler 26 must contain more 90° hybrid couplers 20, 27 than shown in this exemplary embodiment.

Figure 2:
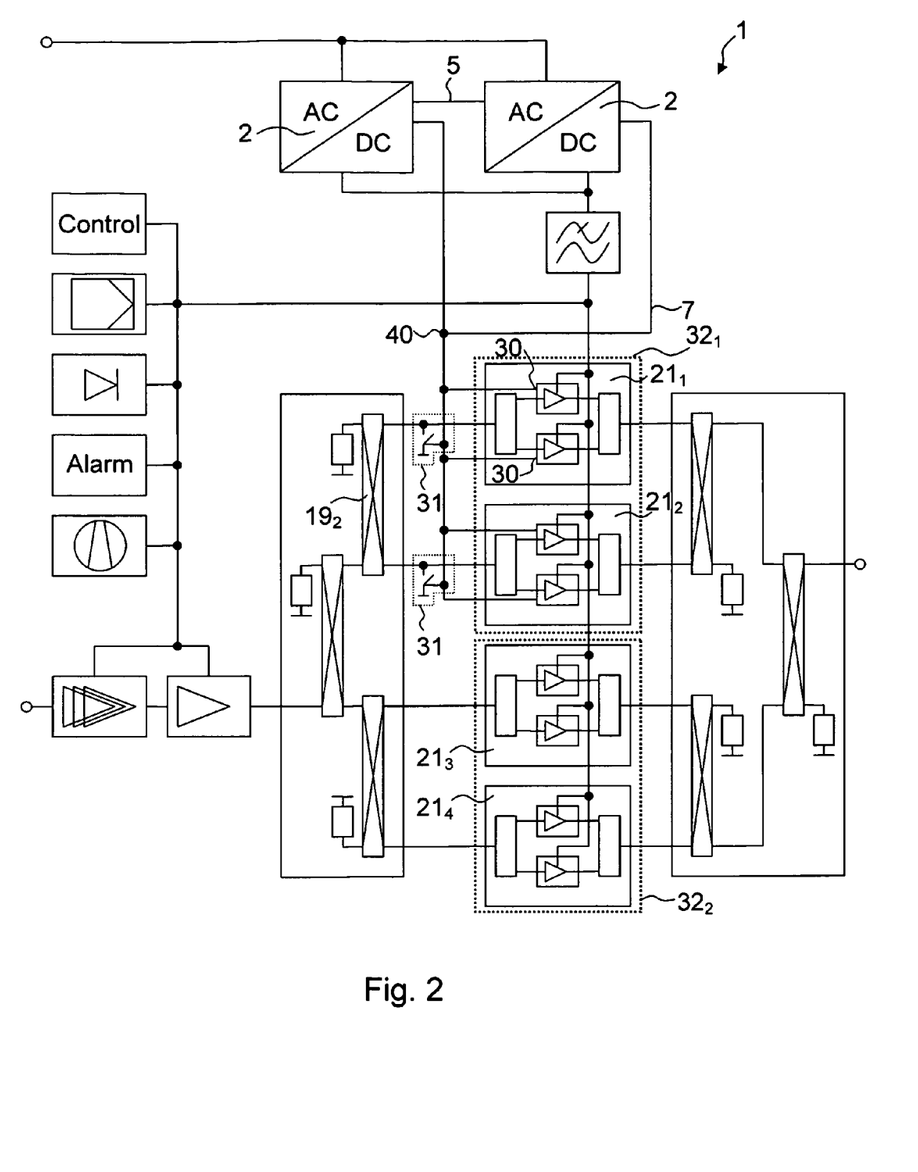
FIG. 2 shows a circuit diagram of a second exemplary embodiment for a circuit arrangement according to the invention for the redundant power supply for a power amplifier.

FIG. 2 shows a circuit diagram of a further exemplary embodiment according to the invention for the circuit arrangement for the redundant power supply for a power amplifier 1. Dependent on the structure of the power amplifier 1, it may be meaningful if further operation of the power amplifier is only possible up to a fixed power output. In the event of a failure of one or more power-supply units, the remaining output power can be calculated according to the formula provided in the introduction. In the exemplary embodiment in FIG. 2, the power amplifier 1 is supplied with energy by exactly two power-supply units 2. In the event of a failure of one power-supply unit 2, further operation of the power amplifier 1 is still meaningfully possible, whereas in the event of a failure of both power-supply units, operation is no longer possible.

In order to reduce the number of switching elements 30 and switching units 31 and thereby lower the cost of the power amplifier 1, in the event of a failure of either power-supply unit 2 the output-stage component 21 which provides a switching element 30 and optionally a switching unit 31 is always switched off. In this case, in the event of a failure of either power-supply unit 2, the output-stage unit 32$_1$ is always actively switched off. Accordingly, in this case, the status lines 7 of all power-supply units 2 are all connected to one another at a node 40. Since each status line 7 is connected to an open collector output of the power-supply unit 2, the common connection at the node 40 functions as an OR-connection. In this exemplary embodiment, if a power-supply unit 2 fails because of a defect, the failed power-supply unit 2 outputs a common error signal via a status line 7, which switches off the bias voltage of the power transistors of the output-stage components 21$_1$, 21$_2$ which are connected to the outputs of the power splitter 19$_2$. Accordingly, the output-stage components 21$_1$, 21$_2$ are switched into an approximately currentless condition. Optionally, the high-frequency input power can still be de-coupled from the output-stage components 21$_1$, 21$_2$, which provide a switching unit 31 to which the common error signal is supplied via the status line 7. However, the other output-stage components 21$_3$, 21$_4$ cannot be switched off.

With the exception of the explanations provided, the structure and method of functioning of this further exemplary embodiment according to the invention for the circuit arrangement for the redundant power supply for a power amplifier 1 correspond with the exemplary embodiment in FIG. 1, to which reference is made at this point.

In a further exemplary embodiment according to the invention, which is not illustrated, more than two power-supply units 2 can also be integrated into the power amplifiers 1 from FIG. 2. Accordingly, the number of output-stage components 21, the number of 90° hybrid couplers 19, 27 in the power splitter 18 and power coupler 26, as well as the switching elements 30 and switching units 31 can be increased arbitrarily. For example, the power amplifier 1 can comprise eight output-stage components 21 and in each case seven 90° hybrid couplers 19, 27 in the power splitter 18 and power coupler 26, which together are supplied by four power-supply units 2. However, only two output-stage components 21 can be connected to switching elements 30 and switching units 31, because operation with a failure of more than one power-supply unit 2 is not meaningful in some applications.

Figure 3:
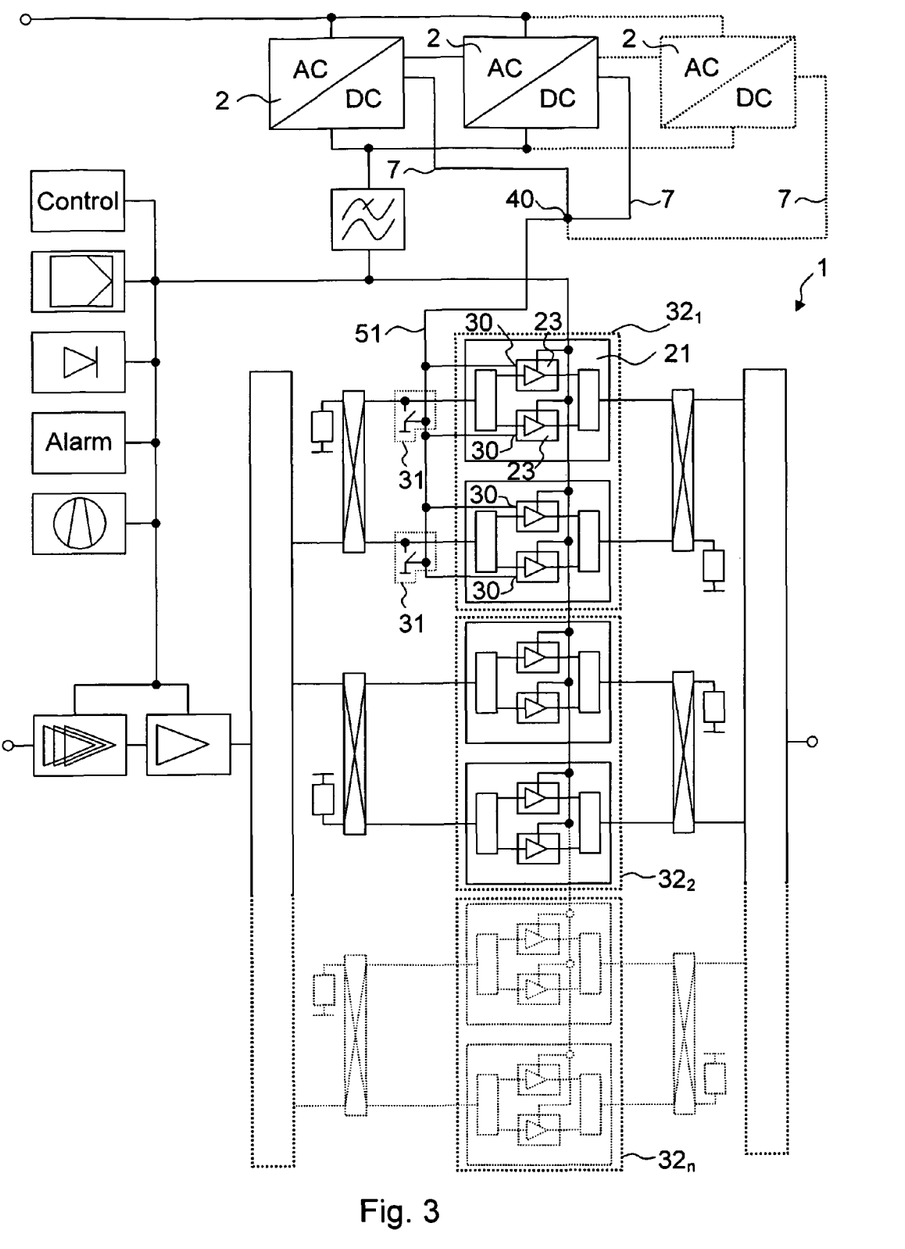
FIG. 3 shows a circuit diagram of a third exemplary embodiment for a circuit arrangement according to the invention for the redundant power supply for a power amplifier.

FIG. 3 shows another exemplary embodiment according to the invention, which is essentially an extension of the circuit diagram from FIG. 2. Accordingly, reference is made here to the description from FIG. 2. In contrast to FIG. 2, n power-supply units 2 now supply n output-stage units 32$_1$, 32$_2$, 32$_n$ with energy. All status lines 7 of the n power-supply units 2 are directly connected to one another at a node 40. Since the status lines 7 are attached to an open collector output of the power-supply units 2, this node 40 can be considered as an OR function. This node 40 is connected only to the switching elements 30 and switching units 31 of the output-stage unit 32$_1$. Regardless of which power-supply unit 2 fails following this, the output-stage components 21 of the output-stage unit 32$_1$ are always actively switched off, or, in the event of a failure of at least one of the n power-supply units 2, the bias voltage of the power transistors of the output-stage component 21 and respectively the output-stage unit 32$_1$, which provide a switching element 30 and/or a switching unit 31 to which the common error signal is supplied, is switched off.

By comparison with the drawing from FIG. 2, considerably more couplers are evident in FIG. 3. For reasons of clarity, only the 90° hybrid couplers which are directly connected to an output-stage component 21 and an output-stage unit 32$_1$ to 32$_n$ respectively are shown. However, the structure and wiring of the 90° hybrid couplers is implemented by analogy with FIG. 2. A particular advantage of this further exemplary embodiment according to the invention, is that wiring costs are reduced, because operation can still be considered meaningful, precisely if a maximum of one power-supply unit 2 fails, or if the power-supply units 2 provide such good reliability that it would be improbable for two power-supply units 2 to fail at the same time.

Figure 4:
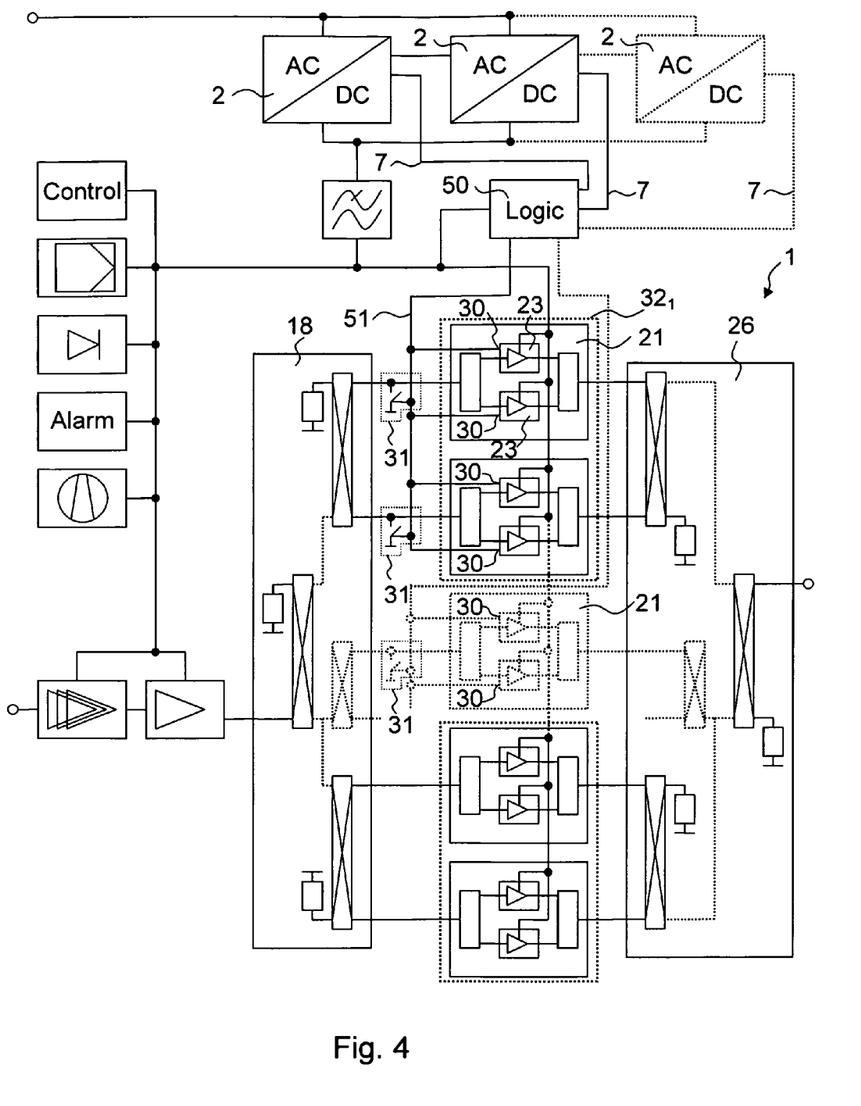
FIG. 4 shows a circuit diagram of a fourth exemplary embodiment for a circuit arrangement according to the invention for the redundant power supply for a power amplifier.

FIG. 4 shows a circuit diagram of a further exemplary embodiment according to the invention for the circuit arrangement for the redundant power supply for a power amplifier 1. The structure and method of functioning correspond substantially with those from FIG. 1. By contrast, this exemplary embodiment according to the invention provides a circuit arrangement, which can integrate n power-supply units 2 into a power amplifier 1, thereby keeping the number of switching elements 30 and switching units 31 and therefore also the production costs as low as possible.

All power-supply units are connected together at their load-end connections. In this exemplary embodiment, the individual status lines 7 of the various power-supply units 2 are not directly connected to one or more switching elements 30 or switching units 31 or to each other. All status lines 7 from these n power-supply units 2 are connected in each case to an input of a logic unit 50, wherein up to n−1 output lines of the logic unit 50 are connected to the switching elements 30 or switching units 31 of up to n−1 output-stage units 32, and an output-stage unit 32 provides two output-stage components 21. The advantage here is that only as many output-stage components 21 must be fitted with switching elements 30 and optional switching units 31, as there are power-supply units 2 which may fail, so that meaningful operation is still just possible.

The logic unit 50 registers the number of failed power-supply units 2 via the error signal of the status line 7 of the power-supply units 2 and switches off the necessary number of output-stage components 21. The bias voltage of the power transistors of the amplifier units 23 of the output-stage components 21 can be switched off via the switching elements 30 and optionally, the high-frequency input power from the input of the output-stage component 21 can be connected via the switching units 31 to earth, so that the power is reflected and supplied to the load-balancing resistor. The switching elements 30 and also the switching units 31 are centrally controlled by the logic unit 50. Accordingly, the number of switching elements 30 and switching units 31 can be kept low, wherein, every failure of a power-supply unit 2 is registered by the logic unit 50 and a switching operation is implemented at the same time. The logic unit 50 is connected to the common power-supply line, to which the central functional units 9 are also connected.

The logic unit 50 itself can be made up of individual logic functions such as AND gates and OR gates. The logic unit 50 is advantageously realized in a micro controller or in a programmable logic module FPGA. Such modules are already provided anyway for control and regulation, and offer the advantage that changes can be implemented simply via software changes. The power splitter 18 and the power coupler 26 contain the required number of 90° hybrid couplers. A connection between a first, a second and a third 90° hybrid coupler is indicated by dotted lines. Dependent on the number of output-stage components 21, more 90° hybrid couplers can be provided in the power splitter 18 and power coupler 26 than shown.

In a similar manner, a further output-stage component 21 is indicated by dotted lines to illustrate that a total of n output-stage components 21 can be incorporated into a power amplifier 1. This shows how, by means of the switching arrangement according to the invention, the power amplifier 1 can be scaled very easily for use by several power-supply units 2, output-stage components 21 and couplers. The output-stage component 21 indicated by dotted lines is provided with switching elements 30 and switching units 31, which are controlled from a central logic unit. Furthermore, a connection to a further output-stage component 21 is indicated by dotted lines, which forms an output-stage unit 32 with the displayed output-stage component 21. However, all further output-stage components 21 need not compulsorily comprise switching elements 30 and switching units 31.

Through this further exemplary embodiment according to the invention of a circuit arrangement for the redundant power supply for a power amplifier 1, a highly redundant system for power supply can be created with a small number of switching elements 30 and switching units 31, which is intended for the use of up to n power-supply units 2.

Figure 5:
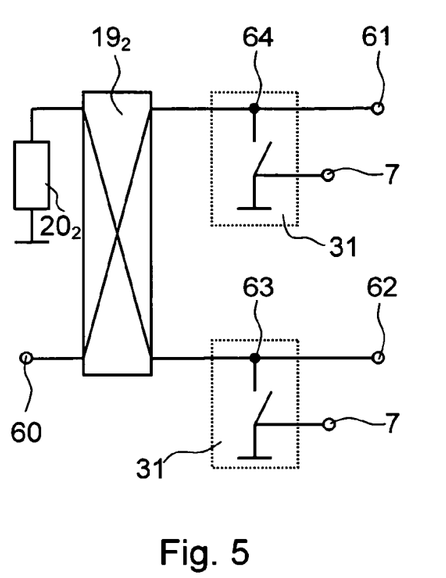
FIG. 5 shows the exemplary connection of a switching element according to the invention to a 90° hybrid coupler.

With reference to the 90° hybrid coupler $19_2$ from the power divider 18 selected as an example, FIG. 5 illustrates why it is necessary for both outputs of the 90° hybrid coupler $19_2$ to be connected synchronously to earth by the switching unit 31, or not. In addition to a load-balancing resistor $20_2$, the 90° hybrid coupler $19_2$ provides a switching unit 31 at both of its outputs, which can connect the output to earth and thereby de-couples both output signals from the output connections 61, 62. The output-stage components $21_1$, $21_2$ are connected to the output connections 61, 62. A high-frequency signal is connected to the input connection 60. During normal operation, both output-stage components $21_1$, $21_2$ are in operation, and the switching units 31 are disposed in the position shown in FIG. 5. A part of the high-frequency signal at the input connection 60 is conducted through the output connection 62 to the output-stage component $21_2$. Another part of the high-frequency signal flows through the 90° hybrid coupler $19_2$ and is conducted with a phase displacement of −90° through the output connection 61 to output-stage component $21_1$. No power is conducted to the load-balancing resistor $20_2$ in the case of a matching.

If the output-stage components $21_1$, $21_2$ are switched off, the switching units 31 are closed and connect both the outputs of the 90° hybrid coupler $19_2$ to earth. A part of the signal which is connected to the input 60 moves in the direction towards the second output connection 62 through the 90° hybrid coupler $19_2$. The phase displacement of the signal at this output of the 90° hybrid coupler $19_2$ is 0°. The signal is reflected at the node 63, which is connected to earth through the switching element 31, wherein the phase displacement is still 0°. A part of this reflected signal moves from the second output of the 90° hybrid coupler $19_2$ back to the input connection 60 of the 90° hybrid coupler $19_2$ and provides a phase displacement of 0° there. A part of this reflected signal moves from the second output of the 90° hybrid coupler $19_2$ through the 90° hybrid coupler $19_2$ and appears with a phase displacement of −90° at the output of the 90° hybrid coupler $19_2$ to which the load-balancing resistor $20_2$ is connected. The part of the signal at input connection 60 of the 90° hybrid coupler $19_2$ which does not appear at the second output passes through the 90° hybrid coupler $19_2$ and appears at a first output with a phase displacement of −90°. The node 64 is connected to earth, so that the signal which is connected to the first output of the 90° hybrid coupler $19_2$ is reflected, wherein the phase displacement is still −90°. A part of the reflected signal passes through the 90° hybrid coupler $19_2$ and leaves with a phase displacement of −90° at the point at which the load-balancing resistor $20_2$ is connected.

The signal coming from the second output and also the signal coming from the first output provide the same phase displacement of −90° at the connection to which the load-balancing resistor $20_2$ is connected. Both signals are summed, and the energy is absorbed by the load-balancing resistor $20_2$. A further part of the signal passes from the first output through the 90° hybrid coupler $19_2$ back to input 60 of the 90° hybrid coupler $19_2$ and provides a phase displacement of −180° there, whereas the signal coming from the second input provides a phase displacement of 0°. Both signals provide the same magnitude with regard to their amplitude, but differ in their phase by 180°, so that they cancel each other out at the input 30. This means that the whole reflected power from both outputs passes to the load-balancing resistor $20_2$ where it is fully absorbed. Therefore, no power is reflected to the input 60. The input 60 provides the same good matching as before the switching. Accordingly, the occurrence of undesirable frequency responses, which could influence the performance of the output-stage amplifiers which are still in operation, can be prevented. However, this only occurs when both outputs of a 90° hybrid coupler $19_2$ are synchronously connected to each other, as is the case in all of these exemplary embodiments of the invention presented.

Figure 6:
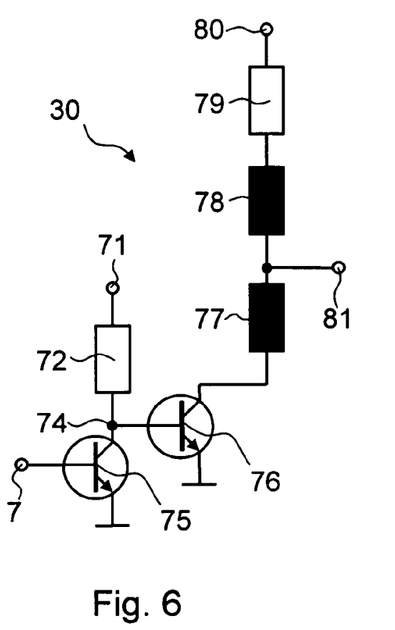
FIG. 6 shows the structure of an exemplary embodiment of the switching element for the circuit arrangement according to the invention for the redundant power supply for a power amplifier.

FIG. 6 shows a possible embodiment of the switching element 30 of the circuit arrangement for the redundant power supply for a power amplifier 1 according to the invention, and how it is used to switch off the bias voltage of the power transistors. A voltage is applied to the connection 71, which is supplied through a series resistor 72 to the node 74, and thus to the collector of the transistor 75. The base of the transistor 75 is connected to the signal line 7, through which the error signal, which comes from the power-supply unit 2 or the logic unit 50, is supplied to the transistor 75. The emitter is connected to earth. The base of a further transistor 76 is connected to the node 74. The emitter of this further transistor 76 is again connected to earth. The collector of this transistor 76 is connected to the base 81, or the gate 81, of the power transistor via an inductance 77.

A DC voltage, which is applied at the connection 80, is supplied to the base or the gate 81 of the power transistor through an inductance 78 and a series resistor 79. The inductance 78 serves to ensure that no high-frequency signals are coupled into the DC voltage supply. During normal operation, the transistor 75 conducts, thereby inhibiting the transistor 76. In the event of an error, the transistor 75 is inhibited, whereupon the transistor 76 begins to conduct. The DC voltage component, which is supplied to the base or the gate 81 of the power transistor through the series resistor 79 and the inductance 78, is again drained to earth through the inductance 77 and the transistor 76. The output signal can be inverted directly via the logic unit 50, so that the transistor 75 is not required. In addition to transistors, other semiconductor-based components can also be used. Mechanical switches such as relays can also be used for the switching element 30. Because only signal streams and accordingly no high power can be connected, it is possible to use the compact and cost-efficient construction offered by SMD technology.

Figure 7:
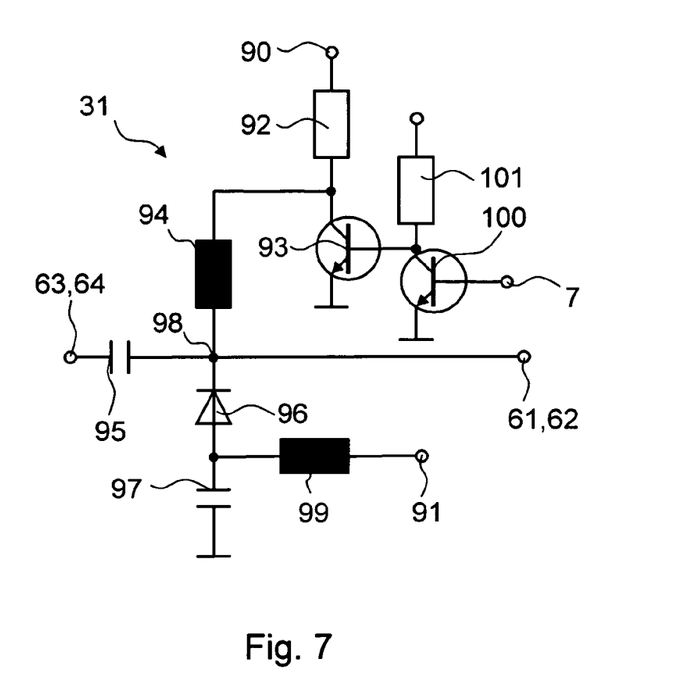
FIG. 7 shows the structure according to the invention and the connection of a switching unit according to an exemplary embodiment.

FIG. 7 shows a possible embodiment of the switching unit 31 of the circuit arrangement for the redundant power supply for a power amplifier 1 according to the invention, and how it is used to de-couple the high-frequency input power from the output-stage component 21. The input connection 63, 64 corresponds to the node 63 or the node 64 from FIG. 5. This is connected via the coupling capacitor 95 to the node 98, and thus to the output connection 61, 62, which is also shown in FIG. 5. The cathode of a PIN diode 96 (English: positive intrinsic negative diode) is connected to the node 98. The anode of the PIN diode 96 is connected, on the one side, to earth through a capacitor 97 and, on the other side, to the input connection 91 through the inductance 99.

The node 98 is additionally connected, on the one side, to the collector of a transistor 93 via an inductance 94 and, on the other side, to the series resistor 92. The series resistor 92 is connected at its second output to the input connection 90. The emitter of the transistor 93 is connected to earth. The collector of a further transistor 100 is connected to the base of the transistor 93. A DC voltage is connected to the collector of the transistor 100 via a series resistor 101. The emitter of the transistor 100 is connected to earth, and the error signal, which comes through the status line 7, is connected to the base of the transistor 100. A DC voltage which is greater than the DC voltage applied to the input connection 91 must be applied to the input connection 90.

During normal operation, the transistor 100 conducts, and the transistor 93 inhibits. The voltage at the cathode of the diode 96 is higher than at the anode of the diode 96. The diode 96 is non-conducting in this state. A high-frequency input power, which is applied to the input connection 63, 64, can be tapped at the output connection 61, 62.

In the event of an error, the transistor 100 inhibits, whereupon the transistor 93 begins to conduct. The potential at the cathode of the diode 96 is drawn to earth through the inductance 94 and the transistor 93. The diode 96 begins to conduct, because the potential at the anode is unchanged. The high-frequency input power is conducted to earth through the coupling capacitor 95 and the capacitor 97, wherein a total reflection for the high-frequency occurs at the node 61, 64. This means that the signal, which is fed in at the node 63, 64, is fully reflected. The inductances 94 and 99 prevent a part of the high-frequency power input from coupling into the DC power-supply circuit.

The invention is not restricted to the exemplary embodiments presented. All elements described and/or illustrated can be combined as required within the framework of the invention. If the error signal is inverted via the logic unit 50, the transistor 100, for example, is not required. Instead of the PIN diode circuit shown, the circuit can also be constructed with a relay.

The invention claimed is:

1. A circuit arrangement for the redundant power supply for a power amplifier, wherein the power amplifier provides several output-stage components and several power-supply units and wherein the power-supply units are connected together at their load-end connections and supply the output-stage components with energy, wherein in the event of a failure of at least one power-supply unit at least one output-stage component is actively switched off, and wherein two output-stage components are controlled respectively via a 90° hybrid coupler and form an output-stage unit.

2. The circuit arrangement according to claim 1, wherein in the event of a failure, every power-supply unit outputs an error signal via a status line and the switching off of the at least one output-stage component is implemented dependent upon the error signal.

3. The circuit arrangement according to claim 2, wherein the status lines of every power-supply unit are connected to one another in such a manner that a common error signal is output.

4. The switching arrangement according to claim 2, wherein the status lines of n power-supply units are each connected to an input of a logic unit and that n−1 output lines of the logic unit are connected respectively to at least one output-stage component.

5. The circuit arrangement according to claim 2, wherein in the event of a failure of at least one power-supply unit, the output-stage component to which the error signal of this power-supply unit is supplied, is switched off by connecting a bias voltage of the power transistors of the output-stage component via a switching element to earth.

6. The switching arrangement according to claim 5, wherein the output-stage component is de-coupled from a high-frequency control power by a switching unit, and the error signal of this power-supply unit is supplied to the switching unit.

7. The switching arrangement according to claim 3, wherein in the event of a failure of at least one power-supply unit, the bias voltage of the power transistors of the output-stage component which provides a switching element to which the common error signal is supplied, is switched off.

8. The circuit arrangement according to claim 7, wherein the output-stage component which comprises a switching unit is de-coupled via the latter from a high-frequency control line, and the common error signal is supplied to the switching unit.

9. The switching arrangement according to claim 4, wherein in the event of a failure of n−1 power-supply units, a bias voltage of the power transistors of up to n−1 output-stage components is switched off in each case by a switching element, and each switching element is connected to an output of the logic unit.

10. The switching arrangement according to claim 9, wherein additionally, up to n−1 output-stage components are de-coupled from a high-frequency control line in each case by a switching unit, and this switching unit is connected to an output line of the logic unit.

11. The circuit arrangement according to claim 6, wherein the switching unit provides a PIN diode, through which the high-frequency control power is connected to earth.

12. The circuit arrangement according to claim 1, wherein the 90° hybrid coupler provides a load-balancing resistor in which the reflected power is absorbed.

13. A circuit arrangement for the redundant power supply for a power amplifier, wherein the power amplifier provides several output-stage components and several power-supply units and wherein the power-supply units are connected together at their load-end connections and supply the output-stage components with energy, wherein in the event of a failure of at least one power-supply unit at least one output-stage component is actively switched off, and wherein the power-supply units are connected at their load-end connections to at least one common filter in order to prevent an influence of the power-supply units through a high-frequency energy generated by the output-stage components.

14. The switching arrangement according to claim 1, wherein a load of the output-stage components connected to the power-supply units is subdivided in such a manner that every power-supply unit provides the same power during error-free operation.

15. A circuit arrangement for the redundant power supply for a power amplifier, wherein the power amplifier provides several output-stage components and several power-supply units and wherein the power-supply units are connected together at their load-end connections and supply the output-stage components with energy, wherein in the event of a failure of at least one power-supply unit at least one output-stage component is actively switched off, and wherein the power amplifier provides functional units which are necessary for the operation of the power amplifier, and that these functional units are connected via a common power-supply line to all power-supply units.

16. The switching arrangement according to claim 15, wherein the functional units comprise a pre-amplifier, a driver amplifier, a control, an output regulator with high-frequency detector, an error monitor and at least one fan.

* * * * *